United States Patent [19]
Takahashi et al.

[11] Patent Number: 5,719,617
[45] Date of Patent: Feb. 17, 1998

[54] ILLUMINATION SYSTEM FOR SUPERPOSING LIGHT BEAMS ONE UPON ANOTHER ON A SURFACE USING A PROJECTING SYSTEM HAVING DIFFERENT FOCAL POINT POSITIONS

[75] Inventors: Kazuhiro Takahashi; Takahisa Shiozawa, both of Utsunomiya, Japan

[73] Assignee: Canon Kabushiki Kaisha, Tokyo, Japan

[21] Appl. No.: 389,769

[22] Filed: Feb. 16, 1995

[30] Foreign Application Priority Data

Feb. 16, 1994 [JP] Japan .................................. 6-041998

[51] Int. Cl.⁶ .................................................. B41J 2/47
[52] U.S. Cl. ........................... 347/241; 347/256; 355/70
[58] Field of Search ................................. 347/256, 258, 347/241, 244, 134; 355/68, 69, 70

[56] References Cited

U.S. PATENT DOCUMENTS

| | | | |
|---|---|---|---|
| 4,617,469 | 10/1986 | Takahashi et al. | 250/548 |
| 4,659,225 | 4/1987 | Takahashi | 356/358 |
| 4,682,885 | 7/1987 | Torigoe | 355/67 |
| 4,822,975 | 4/1989 | Torigoe | 219/121.85 |
| 4,851,882 | 7/1989 | Takahashi et al. | 355/46 |
| 4,874,954 | 10/1989 | Takahashi et al. | 250/548 |
| 4,937,618 | 6/1990 | Ayata et al. | 355/43 |
| 4,947,030 | 8/1990 | Takahashi | 250/201.1 |
| 4,974,919 | 12/1990 | Muraki et al. | 350/6.6 |
| 5,091,744 | 2/1992 | Omata | 355/53 |
| 5,097,291 | 3/1992 | Suzuki | 355/69 |
| 5,121,160 | 6/1992 | Sano et al. | 355/53 |
| 5,263,250 | 11/1993 | Nishiwaki et al. | 29/890.1 |
| 5,345,292 | 9/1994 | Shiozawa et al. | 355/67 |
| 5,453,814 | 9/1995 | Aiyer | 355/70 |
| 5,463,497 | 10/1995 | Muraki et al. | 359/618 |
| 5,475,491 | 12/1995 | Shiozawaa | 355/68 |

FOREIGN PATENT DOCUMENTS 0486316  5/1992  European Pat. Off. .

*Primary Examiner*—Mark J. Reinhart
*Attorney, Agent, or Firm*—Fitzpatrick, Cella, Harper & Scinto

[57] ABSTRACT

An illumination device for illuminating a surface to be illuminated, includes a light source and an irradiation optical system for mixedly projecting light beams from the light source to the surface, wherein the irradiation optical system has a first focal point with respect to a first plane, which is disposed at a position out of the surface.

26 Claims, 7 Drawing Sheets

ILLUMINATION SYSTEM FOR SUPERPOSING LIGHT BEAMS ONE UPON ANOTHER ON A SURFACE USING A PROJECTING SYSTEM HAVING DIFFERENT FOCAL POINT POSITIONS

FIELD OF THE INVENTION AND RELATED ART

This invention relates to an illumination device and an exposure apparatus. More particularly, the invention is concerned with an illumination device and an exposure apparatus suitably usable, for example, in a lithographic process of manufacturing processes for the manufacture of devices such as semiconductor devices (such as ICs or LSIs) image pickup devices (such as CCDs), display devices (such as liquid crystal panels) or magnetic heads. In another aspect, the invention is concerned with a device manufacturing method using such an illumination device or such an exposure apparatus.

The degree of integration of a semiconductor device such as an IC or LSI has increased considerably, and the fine processing technology for a semiconductor wafer has advanced notably. As for a projection exposure apparatus which is at a core of the fine processing technology, many proposals have been made: examples are a unit magnification exposure apparatus (mirror projection aligner) having a unit magnification reflection optical system with an arcuate exposure region for scanning a mask and a photosensitive substrate for exposure of the whole surface of the photosensitive substrate, and a reduction projection exposure apparatus (stepper) having a refraction optical system for forming an image of a pattern of a mask on a photosensitive substrate while moving the substrate in a step-and-repeat manner so as to print the images on the whole surface of the substrate.

Among these projection exposure apparatuses, a stepper has an advantage over a mirror projection aligner in the point of resolution or registration precision. For such a stepper, a step-and-scan type stepper with which a high resolution and an enlarged picture field size are attainable, has been proposed.

An example of such a stepper is discussed in detail in "O Plus E", February, 1993, pp.96–99. This type of exposure apparatus has a slit-like exposure region, and each shot is exposed with slit-like light coming from a mask. Upon completion of a scan exposure of one shot, the wafer steps to a next shot and the exposure of that shot starts. This is repeated to execute exposures of the whole wafer.

On the other hand, the projection exposure technology has advanced particularly with respect to the resolution to allow formation of a pattern image of a size of 0.5 micron or less. The improvement of resolution is realized by enlarging the numerical aperture (N.A.) of a projection optical system of the exposure apparatus or by using a shorter wavelength of exposure light.

Generally, the shorter the wavelength of the exposure light is, the smaller the transmissivity of a glass material is. The number of glass materials usable for a projection optical system thus reduces. With limited variation of glass materials, correction of chromatic aberration is difficult to achieve. It is therefore necessary to narrow the band width of the exposure wavelength to a level where the effect of chromatic aberration is so small as can be disregarded. For example, for a projection optical system to be used with light of a wavelength not longer than 300 nm, only silica or fluorite is usable as its glass material and, therefore, a laser is used as an exposure light source.

Of lasers, an excimer laser has high energy and thus high throughput is possible. For this reason, it is incorporated as a light source of an exposure apparatus which uses short wavelength light.

When a pulse light emission excimer laser is used as a light source in a scanning exposure apparatus of mirror projection type or step-and-repeat scan type, an error in scan speed or pulse light emission timing may result in uneven exposure on a mask surface or a wafer surface.

U.S. Pat. No. 4,822,975 assigned to the same assignee of the subject application discloses an exposure apparatus effective to avoid such a problem, wherein a defined light intensity distribution on a surface to be irradiated, in the scan direction, is of isosceles triangle or trapezoid shape, by which the required precision of synchronism of pulse light emission and scan speed is loosened.

This will now be briefly reviewed by reference to FIGS. 1 and 2. In FIGS. 1 and 2, for convenience in explanation, a case where each shot is exposed with one pulse is illustrated. FIG. 1 shows an example wherein the light intensity distribution in the scan direction has a rectangular shape, and it illustrates the exposure amounts at different positions in scan direction when the timing of the second pulse emission deviates. On the other hand, FIG. 2 shows an example wherein the light intensity distribution in the scan direction has a trapezoidal shape, and it illustrates the exposure amounts at different positions when, similarly, the timing of the second pulse emission deviates.

As will be readily understood from FIGS. 1 and 2, if the error of timing of laser pulse light emission is of a similar degree, the unevenness of exposure amount is smaller in the case of the trapezoidal light intensity distribution. While FIGS. 1 and 2 are examples wherein the exposure of one shot is executed with one pulse, also in an example where the exposure of each position is executed with plural pulses, the unevenness of exposure amount due to deviation of pulse emission timing is smaller in the case of the trapezoidal distribution of FIG. 2.

In the aforementioned U.S. patent, a desired shape of intensity distribution in the scan direction is defined by using a light attenuating element such as an ND filter, for example, inserted into the path of illumination light.

SUMMARY OF THE INVENTION

It is an object of the present invention to provide an improved illumination device by which a light intensity distribution of a desired shape such as a trapezoidal shape can be defined efficiently.

It is another object of the present invention to provide an improved exposure apparatus by which a light intensity distribution of a desired shape such as a trapezoidal shape can be defined efficiently.

It is a further object of the present invention to provide a device manufacturing method for manufacturing devices by using such an illumination device or exposure apparatus.

In accordance with a first aspect of the present invention, there is provided an illumination device for illuminating a surface such as a mask, to be illuminated, comprising: a light source; and an irradiation optical system for mixedly projecting light beams from said light source to the surface, wherein said irradiation optical system has a first focal point with respect to a first plane, disposed at a position out of the surface.

In accordance with a second aspect of the present invention, there is provided an illumination device for illuminating a surface such as a mask, to be illuminated, comprising: secondary light source forming means for forming a secondary light source by use of light from a light source; and a collecting optical system for mixedly directing light beams from said secondary light source to the surface, said collecting optical system having a first focal point with respect to a first plane, disposed at a position out of the surface.

In accordance with a third aspect of the present invention, there is provided a scan type exposure apparatus for scanning a mask and a substrate with light in a scan direction to thereby expose the substrate with a pattern of the mask, said apparatus comprising: a light source; and an irradiation optical system for mixedly projecting light beams from said light source to the mask, wherein said irradiation optical system has a first focal point with respect to a first plane containing the scan direction, disposed at a position out of the mask, and a second focal point with respect to a second plane containing a direction perpendicular to the scan direction, disposed at substantially the same position as the mask.

In accordance with a fourth aspect of the present invention, there is provided a scan type exposure apparatus for scanning a mask and a substrate with light in a scan direction to thereby expose the substrate with a pattern of the mask, said apparatus comprising: secondary light source forming means for forming a secondary light source by use of light from a light source; and a collecting optical system for mixedly directing light beams from said secondary light source to the mask, said collecting optical system having a first focal point with respect to a first plane including the scan direction, disposed at a position out of the mask, and a second focal point with respect to a second plane including a direction perpendicular to the first plane, disposed at substantially the same position as the mask.

In accordance with a fifth aspect of the present invention, there is provided a scan type exposure apparatus for scanning a mask and a substrate with light in a scan direction to thereby expose the substrate with a pattern of the mask, said apparatus comprising: a laser; secondary light source forming means for forming a secondary light source by use of light from said laser; and a collecting optical system for mixedly directing light beams from said secondary light source to the mask, said collecting optical system having different focal lengths with respect to a first plane including the scan direction and a second plane perpendicular to the first plane, respectively, and said collecting optical system having a first focal point with respect to the first plane, disposed at a position out of the mask, and a second focal point with respect to the second plane, disposed at substantially the same position as the mask.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
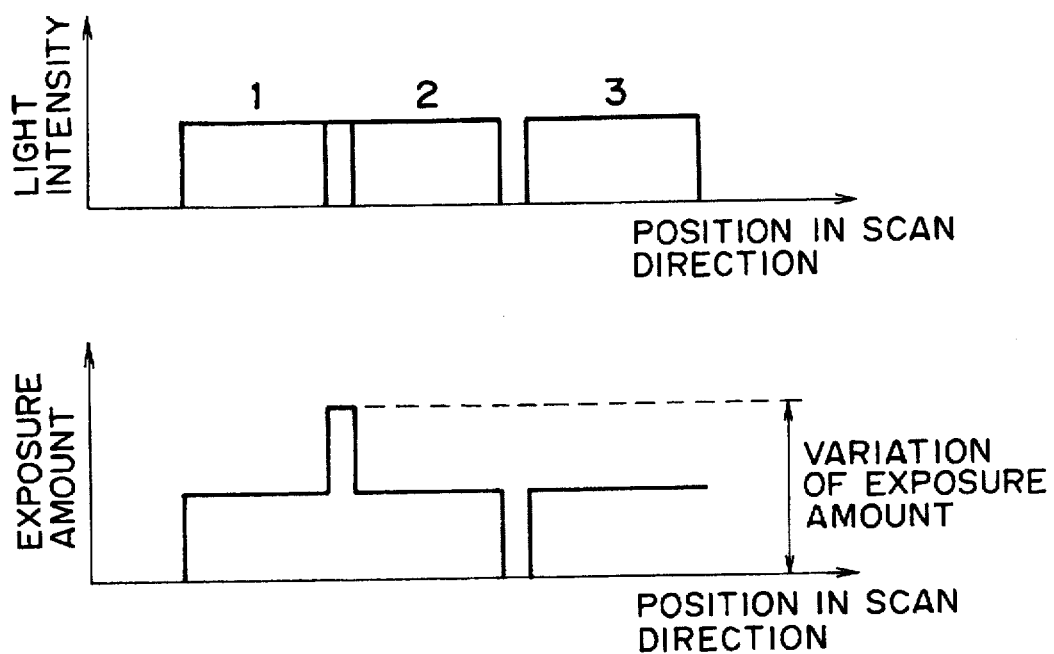
FIG. 1 is a schematic view for explaining exposure amounts in a case where, in scanning exposure, the scan speed or pulse emission timing deviates.
Figure 2:
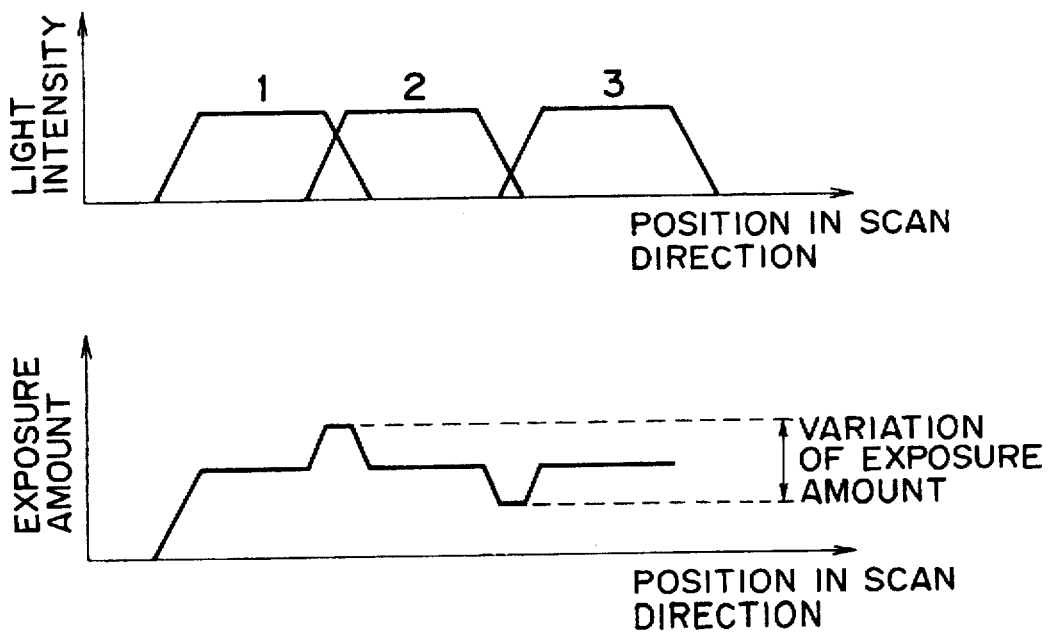
FIG. 2 is a schematic view for explaining exposure amounts in a case where, in scanning exposure, the scan speed or pulse emission timing deviates.
Figure 3:
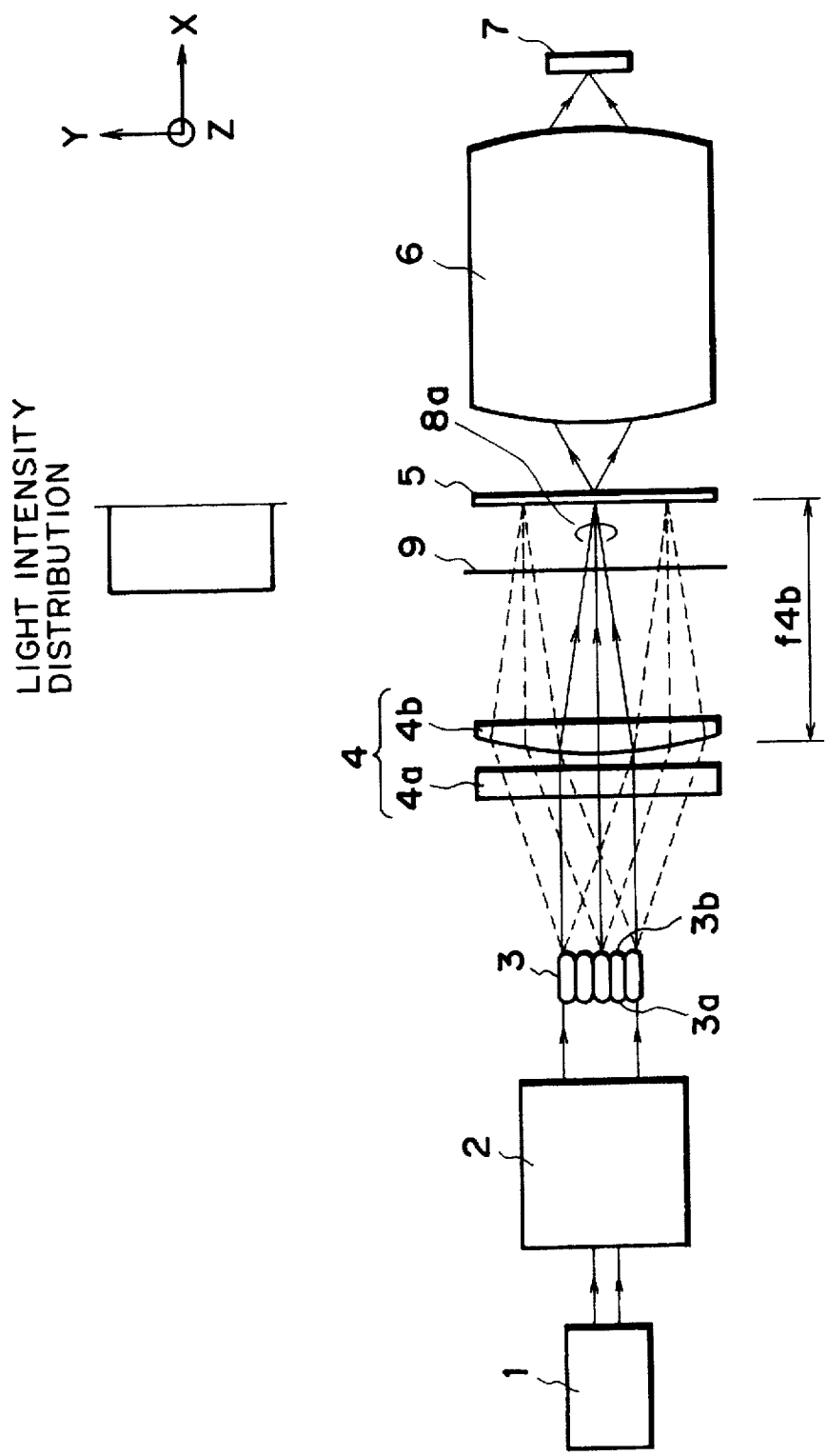
FIG. 3 is a schematic view of a main portion of a first embodiment of the present invention, taken along an X-Y plane.
Figure 4:
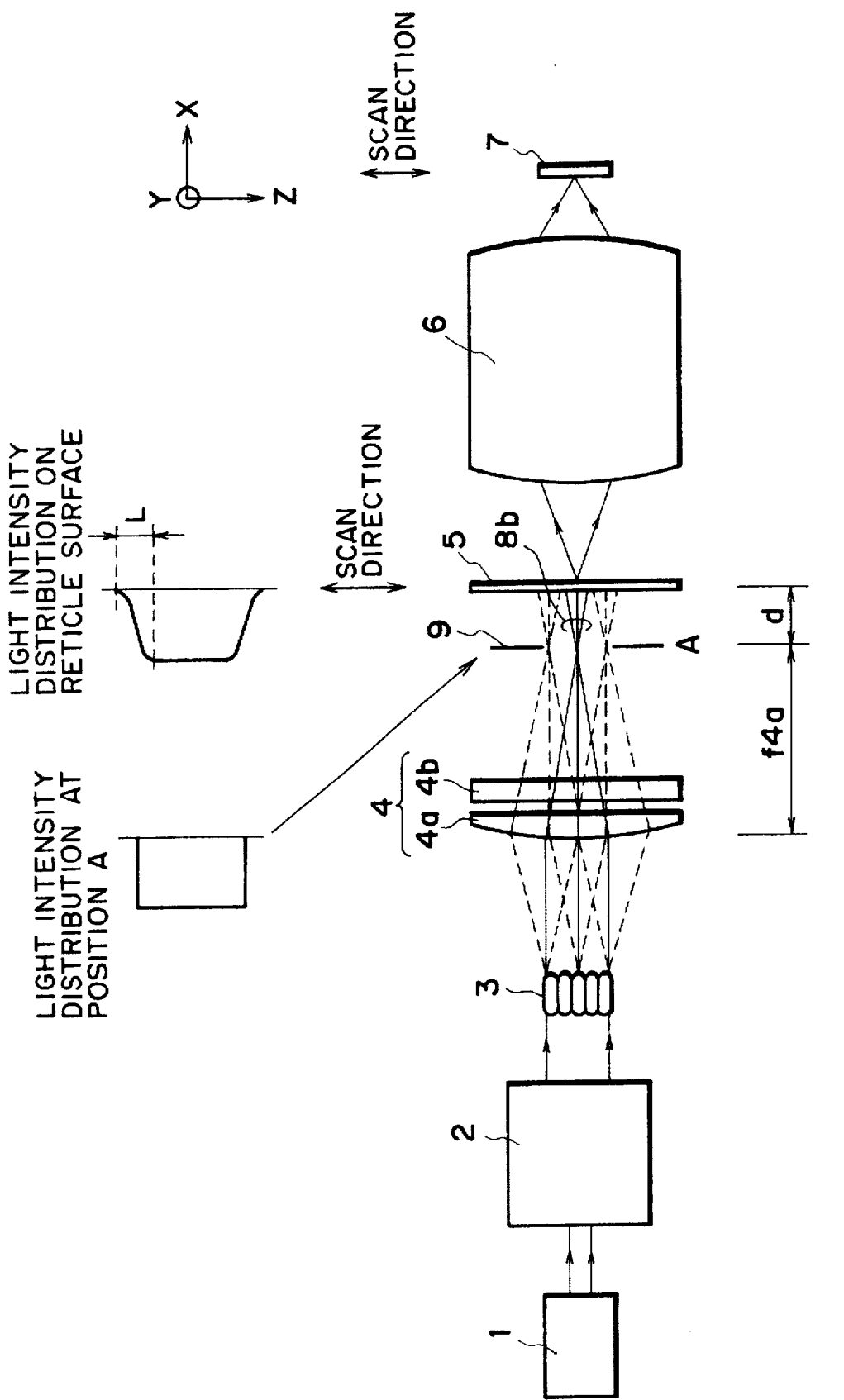
FIG. 4 is a schematic view of the main portion of the first embodiment of the present invention, taken along a Z-X plane.

FIG. 3 is a schematic view of a main portion of a first embodiment of the present invention, taken along a X-Y plane. FIG. 4 is a schematic view of the main portion of the first embodiment of the present invention, taken along a Z-X plane. Namely, FIG. 4 is a schematic view along the Z-X plane, viewing FIG. 3 in a direction perpendicular to the sheet of the drawing. In FIGS. 3 and 4, the direction of the optical axis of an illumination system (projection optical system) is taken on the X axis, while the scan direction of a mask and a photosensitive substrate (wafer) is taken on the Z axis.

In FIGS. 3 and 4, denoted at 1 is a laser light source which comprises, for example, a band-narrowed excimer laser of pulse emission type. The laser light of substantially parallel (collimated) light emitted by the laser light source 1 enters an incoherency transformation means 2 which serves to transform the received light into incoherent light and to emit the latter.

The incoherency transformation means 2 functions to provide incoherency transformation so as to avoid production of an interference fringe or a speckle pattern on the surface of a wafer 7, to be described later, in response to division of the laser light or the scan of the same. Also, it has a beam shaping function for emitting light while adjusting the shape of the light from the laser light source 1 in accordance with the shape of an optical integrator 3.

The light from the incoherency transformation means 2 is projected on an entrance surface 3a of the optical integrator 3. The optical integrator 3 comprises a plurality of small lenses arrayed one-dimensionally or two-dimensionally, with a predetermined pitch, along a plane perpendicular to the optical axis. The optical integrator 3 has a light exit surface 3b which provides a secondary light source plane. A plurality of light beams emerge from this light exit surface 3b, and they enter an illumination optical system 4 such as a condenser lens, comprising an anamorphic optical system.

The illumination optical system 4 serves to collect or converge each light from the exit surface 3b of the optical integrator 3, and it illuminates through a slit opening of a slit 9 a reticle (mask) 5 having a circuit pattern formed thereon. Denoted at 6 is a projection optical system for projecting the semiconductor device circuit pattern of the reticle 5 onto the surface of a wafer (photosensitive substrate) 7, by which an image of the circuit pattern is formed on the wafer 7 surface. The illumination optical system 4 functions so that the light exit surface 3b of the optical integrator 3 and the pupil plane of the projection optical system 6 are disposed substantially in an optically conjugate relationship with each other.

In this embodiment, the reticle 5 and the wafer 7 are moved in the scan direction as depicted by an arrow while retaining a fixed interrelation between them, by which the projection exposure process is executed. Here, the illumination optical system 4 comprises an anamorphic optical system having two cylindrical lenses 4a and 4b. Of these lenses, the cylindrical lens 4a has a shape with a surface having a refracting power (focal length f4a) only within the Z-X plane, as illustrated in FIG. 4. The cylindrical lens 4b has a shape with a surface having a refracting power (focal length f4b) (f4b≠f4a) only within the X-Y plane, as illustrated in FIG. 3.

In FIG. 3, solid lines 8a depict chief light rays, of the rays from the small lenses, emitted from the light exit surface 3b of the optical integrator 3. The chief rays 8 are collected by the cylindrical lens 4b and, through the slit 9, they are projected on the same position upon the reticle 5. Here, upon the reticle 5 surface, there is produced a light intensity distribution in the Y-axis direction which is of an approximately flat rectangular shape such as shown in FIG. 3.

On the other hand, within the Z-X plane of FIG. 4, the chief rays 8b of the rays emitted from the optical integrator 3 are collected by the cylindrical lens 4a, at position A spaced from the reticle 5 along the optical axis direction by a predetermined distance (d). At this position A, substantially uniform illumination is provided by means of the optical integrator 3 and the illumination optical system 4. As a result, at this position, the light intensity distribution in the scan direction (Z-axis direction) is of approximately a flat rectangular shape as illustrated in FIG. 4.

On the other hand, since the reticle 5 is spaced from the position A by a predetermined distance (d), the light intensity distribution upon the reticle 5 is of a shape close to a symmetric trapezoid, having a flat central portion and sloped opposite end portions. This is a shape effective to reduce uneven exposure when during the scanning exposure process the scan speed and/or the pulse emission timing deviates.

With the above-described optical arrangement of this embodiment, a light quantity distribution of a desired shape is defined in an illumination area on the reticle 5 surface. This desired shape corresponds to the light intensity distribution effective to reduce uneven exposure even when the scan speed and/or the pulse emission timing deviates, and it may be a symmetric trapezoidal shape or a shape close to it.

Now, if the distance between the position A and the reticle 5 is denoted by d and the angle of light impinging on the surface, to be irradiated, is denoted by θ, then the width L of the light intensity distribution on the reticle 5 surface to be provided by defocus is in proportion to the distance d, and it is expressed as L=2d·tanθ.

In this embodiment, by adjusting the distance to the position A from the reticle 5, the length of the central flat portion of the light intensity distribution on the reticle 5 surface as well as the inclination angle of the slant portions to be provided by defocus are adjusted. For example, in order to enlarge the length of the flat portion and to increase the angle of inclination of the slant portions, a condenser lens 4 as having a refracting power effective to define the position A closer to the reticle 5 may be used.

As described above, the projection exposure apparatus of this embodiment is arranged so that the chief rays emerging from the optical integrator (secondary light source plane) are focused at a position spaced by a predetermined or desired distance along the optical axis from the mask, within a plane that includes the mask scan direction and the optical axis. Also, the mask surface is at a position defocused from the light focusing position (i.e., the focal point position of the condenser lens 4) by which the light intensity distribution upon the mask along the scan direction is formed into a shape close to a symmetric trapezoidal shape, this being attained without decreasing the illumination efficiency.

Additionally, it is arranged so that, with regard to the slit elongating direction perpendicular to the scan direction, the chief rays emerging from the optical integrator 3 are focused upon the mask surface by which the light intensity distribution in the slit elongating direction becomes substantially uniform. With these conditions, high illumination efficiency and small unevenness of exposure amount in scanning exposure at respective positions in the slit light elongating direction are assured.

The slit 9 which serves to adjust the range of illumination in the scan direction is disposed at or adjacent to the position A. This slit 9 has a function for adjusting the width of the opening in the Z-axis direction at any arbitrary position in the Y-axis position. If, at an arbitrary position in the Y-axis position, the light intensity as converted in terms of the Z-axis direction is greater than that at any other position, the width of the opening in the Z-axis direction may be reduced. If it is lower, the width of the opening may be enlarged. While the optical integrator 3 and the condenser lens 4 provide a substantially uniform light intensity distribution in the Y-axis direction, adjusting the width of the opening of the slit 9 in the Z-axis direction, at positions along the Y-axis direction, is effective to further enhance the uniformness of exposure amount in the Y-axis direction during the scanning exposure.

In the present embodiment, as described, a variable width slit is provided at a position where, within a plane which includes the mask scan direction and the optical axis, the chief rays from the small lenses of the optical integrator are focused, to adjust the size of the illumination range in the scan direction. The width thereof may be adjusted in accordance with the illuminance at each position in the lengthwise direction of the slit, by which reduction of exposure non-uniformness is assured.

In the first embodiment shown in FIGS. 3 and 4, the illumination optical system 4 comprises two cylindrical lenses 4a and 4b. However, the illumination optical system 4 of the present invention is not limited to this form. A general condition for such an illumination optical system 4 which has substantially the same advantageous effects as those of the first embodiment is that: if in FIG. 3 the focal length of the illumination optical system 4 within the X-Y plane is f4b, the distance to the reticle 5 from the image side principal plane of the illumination optical system is equal to f4b; also, if in FIG. 4 the focal length of the illumination optical system within the Z-X plane is f4a, the distance to the position A from the image side principal plane of the illumination optical system 4 becomes equal to f4a.

In this embodiment, as described, the illumination optical system 4 comprises an anamorphic optical means such as a cylindrical lens by which different image side focal point positions of the illumination optical system are defined in the scan direction and in a direction perpendicular to the scan direction. However, any other optical means may be used if such an optical function is provided.

In this embodiment, through the scan type exposure apparatus using pulse light, the pattern of the reticle is projected and printed in sequence on the wafer surface. The wafer after being processed by this projection exposure is then processed by a developing process which is known per se and the like, whereby semiconductor devices are produced.

Figure 5:
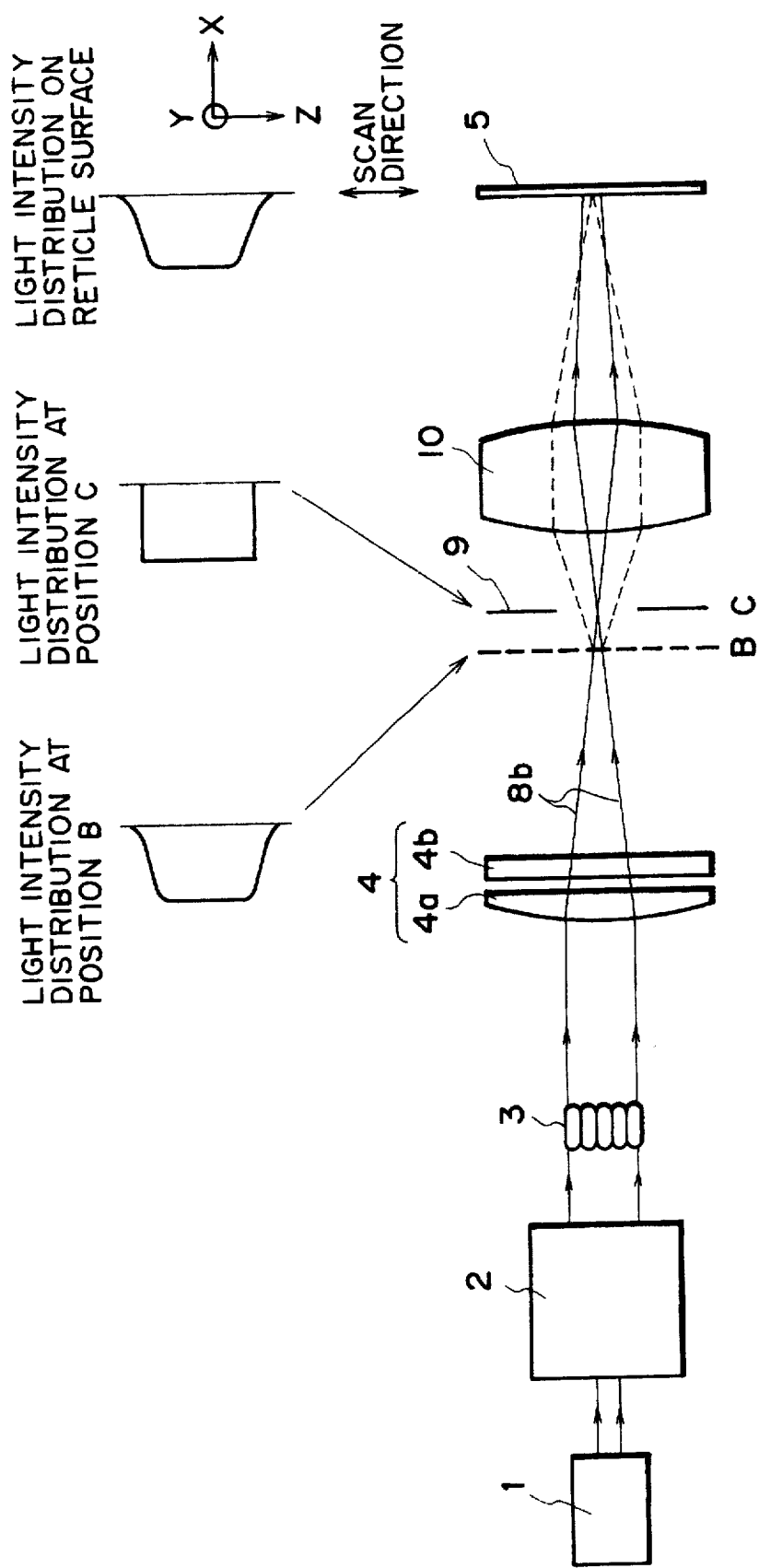
FIG. 5 is a schematic view of a main portion of a second embodiment of the present invention, taken along a Z-X plane.

FIG. 5 is a schematic view of a main portion of a second embodiment taken along the Z-X plane.

This embodiment differs from the first embodiment of FIGS. 3 and 4 in that a relay lens 10 is provided between the illumination optical system 4 and the reticle 5. The remaining portion is of the same structure as the first embodiment. The projection optical system 6 and the wafer 7 are not shown in FIG. 5.

In FIG. 5, the position B corresponds to the position where, within a plane (X-Y plane) perpendicular to the scan direction, the chief rays of the rays emitted from the small lenses of the optical integrator 3 are focused by the illumination optical system 4 having an anamorphic optical element. As depicted by broken lines, the relay lens 10 serves to project the position B onto the reticle 5 surface with a predetermined magnification.

On the other hand, within the Z-X plane, the chief rays 8b emitted from the small lenses of the optical integrator 3 are focused by the illumination optical system 4 at position C which is different from the position B. This position C is spaced from a position optically conjugate with the reticle 5, by a predetermined distance. The slit 9 is disposed at this position.

The light intensity distributions at the reticle 5 position, the position B and the position C, respectively, in the scan direction, are of such shapes as shown in FIG. 5, respectively.

In this embodiment, the position C where within the plane including the scan direction the chief rays of the rays from the optical integrator 3 are focused, is on the reticle 5 side of the light focusing point (position B) within the plane perpendicular to that plane: namely, the former one the downstream side of the latter. This arrangement assures production of a light intensity distribution effective to reduce the non-uniformness of exposure amount without decreasing the illumination efficiency.

Figure 6:
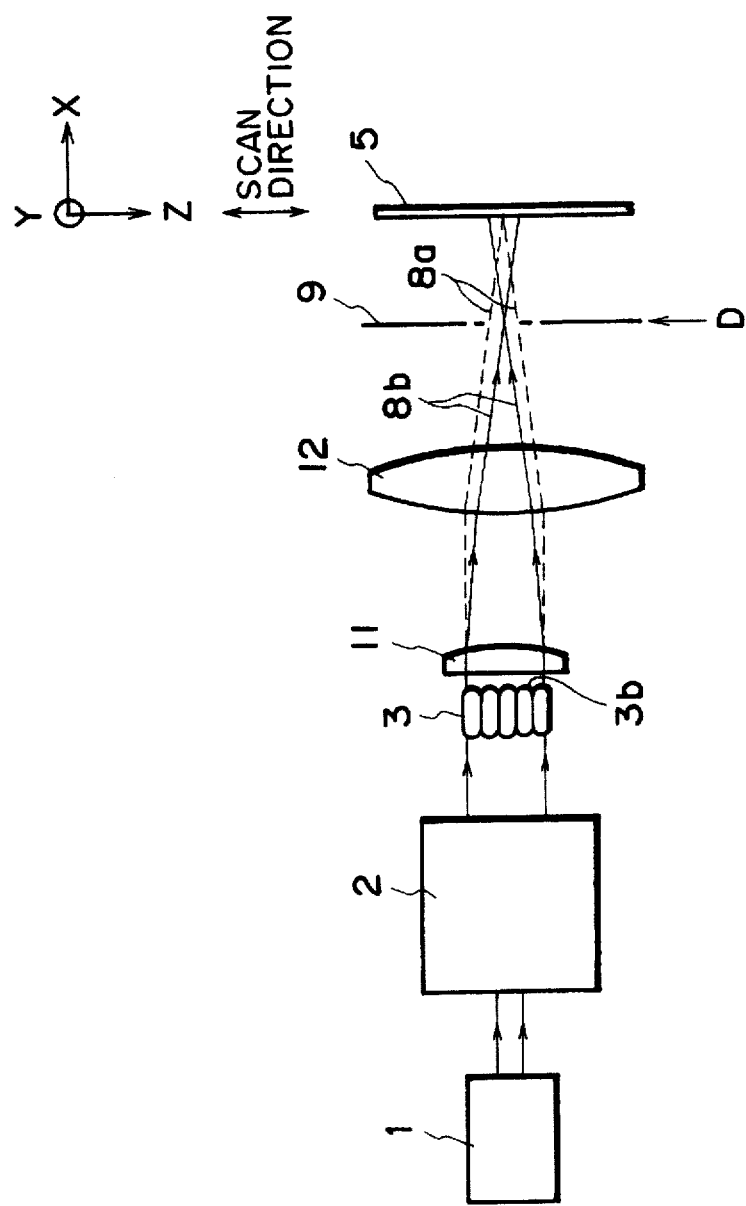
FIG. 6 is a schematic view of a main portion of a third embodiment of the present invention, taken along a Z-X plane.

FIG. 6 is a schematic view of a main portion of a third embodiment of the present invention, taken along the Z-X plane.

This embodiment differs from the first embodiment of FIGS. 3 and 4 in that a field lens (anamorphic optical system) 11 having a refracting power only within the Z-X plane is provided at the light exit surface 3b side of the optical integrator 3 and that a rotationally symmetrical condenser lens 12 is disposed between the field lens 11 and the reticle 5. The remaining portion is of the same structure as that of the first embodiment.

In this embodiment, the field lens 11 and the condenser lens 12 are constituent elements of the illumination optical system. The projection optical system 5 and the wafer 7 are not shown in FIG. 6.

In FIG. 6, the chief rays 8b (solid lines) of the rays emitted from the small lenses of the optical integrator 3 are refracted within the Z-X plane by the field lens (cylindrical lens) 11 which is disposed in the neighborhood of the light exit surface 3b of the optical integrator 3 and which has a refracting power only in the Z direction including the reticle 5 scan direction.

In FIG. 6, these chief rays are focused by the condenser lens 12 at a position D spaced from the reticle 5 surface by a predetermined distance. The slit 9 having a function for adjusting the illumination range in the scan direction, as has been explained with reference to the first embodiment, is disposed at this position D. Since the field lens 11 has no refracting power in the X-Y plane which is perpendicular to the scan direction (Z direction), the chief rays 8a (broken lines) of the rays emitted from the small lenses of the optical integrator 3 are refracted by the condenser lens 4 and are focused at the position of the reticle 5 (surface to be irradiated) as depicted by broken lines in FIG. 6.

Irrespective of the use of the condenser lens 12 which is a rotationally symmetrical optical system, in this embodiment, use of a field lens comprising a cylindrical lens effectively assures production, upon the reticle 5 surface, of a light intensity distribution such as described with reference to the first embodiment or the second embodiment.

In the third embodiment of FIG. 6, the field lens 11 has a refracting power only in the scan direction. However, a lens element having a refracting power also in a direction perpendicular to the scan direction may be used in combination with a condenser lens, provided that they are so arranged that the chief rays of the rays emitted from the small lenses of the optical integrator 3 are focused, within the plane including the scan direction, at a position spaced by a predetermined distance from the reticle 5.

Next, an embodiment of a device manufacturing method which uses a projection exposure apparatus according to any one of the embodiments described above, will be explained.

Figure 7:
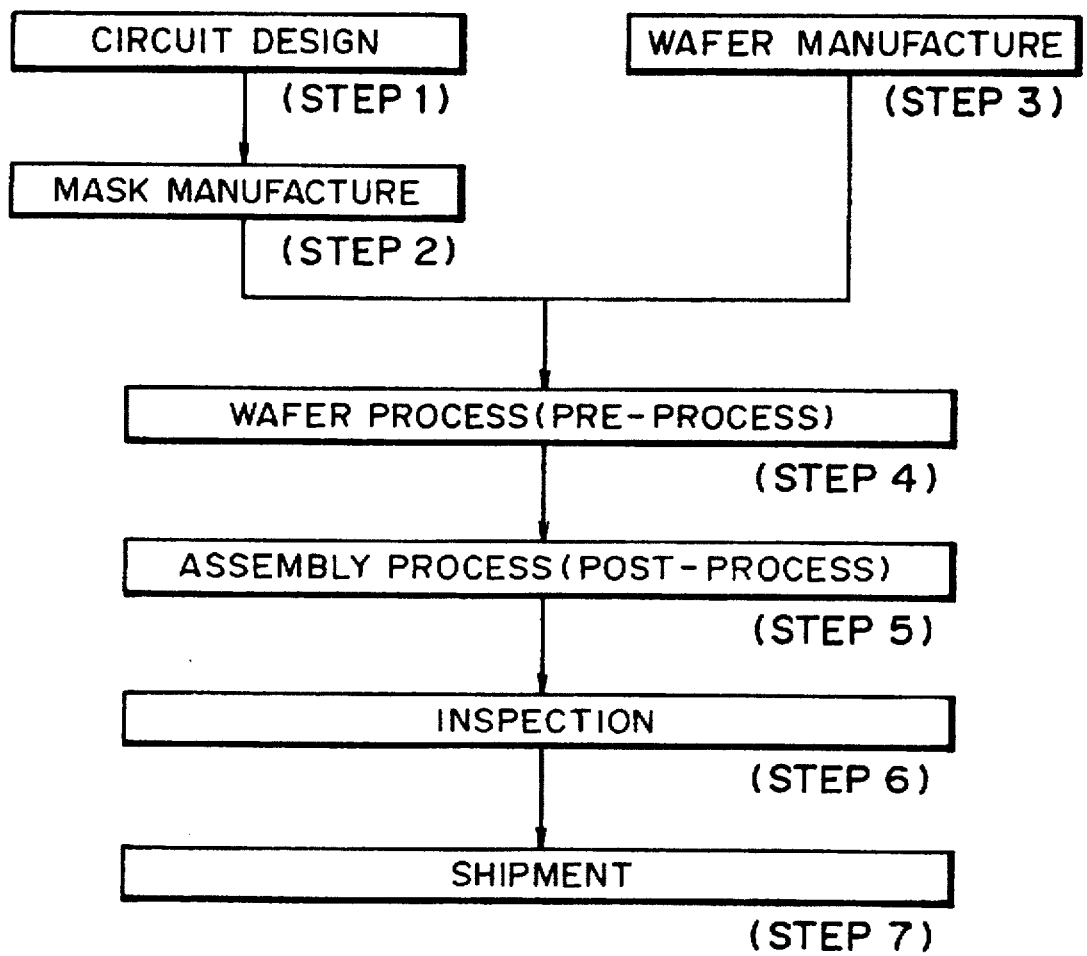
FIG. 7 is a flow chart of device manufacturing processes.

FIG. 7 is a flow chart of the sequence of manufacturing a semiconductor device such as a semiconductor chip (e.g., IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check and so on of the semiconductor devices produced by step 5 are carried out. With these processes, semiconductor devices are finished and they are shipped (step 7).

Figure 8:
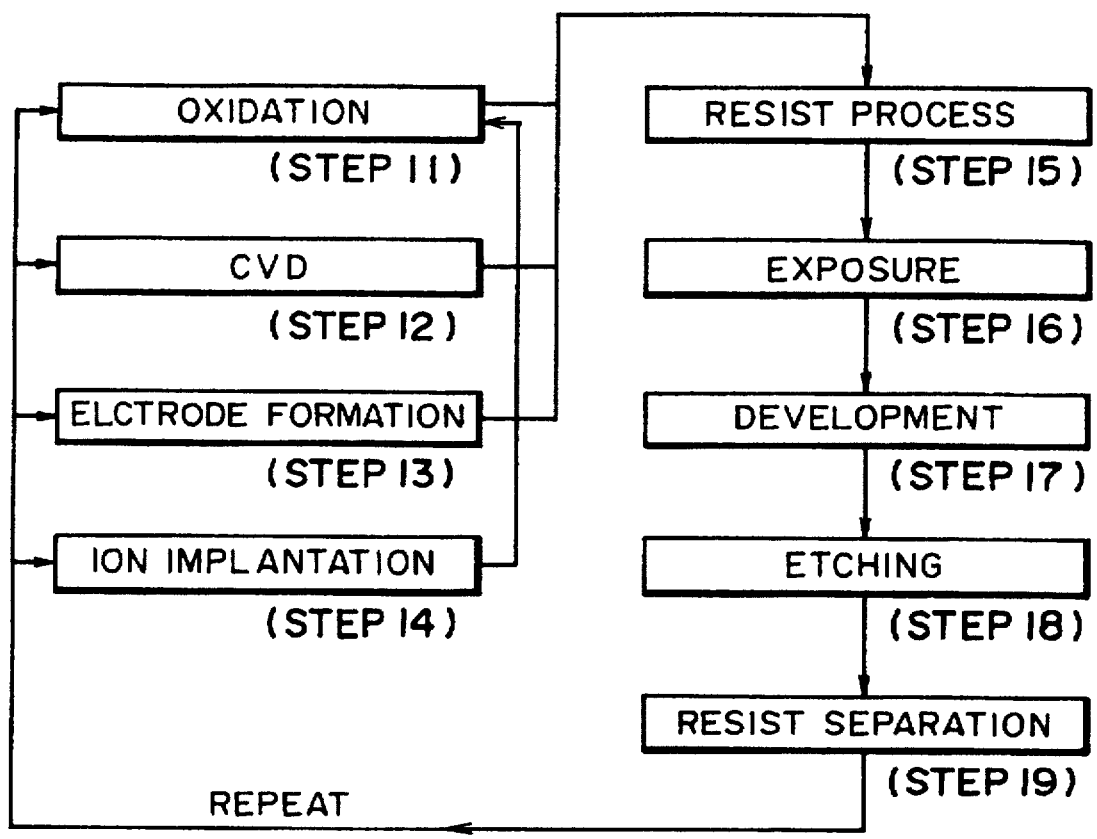
FIG. 8 is a flow chart of a wafer process of FIG. 7.

FIG. 8 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An illumination system, comprising:

a light source for providing plural light beams; and an irradiation optical system for projecting the light beams from said light source to a surface to be illuminated, so that the light beams are superposed one upon another on the surface, wherein said irradiation optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

2. A system according to claim 1, wherein said light source comprises an optical integrator for dividing light into the plural light beams, and wherein said irradiation optical system comprises an anamorphic optical system for directing the light beams to the surface to be illuminated.

3. A system according to claim 1, wherein the light source comprises a laser.

4. A projection exposure apparatus comprising an illumination system as recited in any one of claims 1, 2 and 3 and a projecting optical system for projecting a pattern of a mask, illuminated by said illumination system, onto a substrate.

5. An illumination system, comprising:
  secondary light source forming means for forming a secondary light source with light from a light source; and
  a collecting optical system for projecting light beams from said secondary light source to a surface to be illuminated, so that the light beams are superposed one upon another on the surface, wherein said collecting optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

6. A system according to claim 5, wherein said secondary light source forming means comprises an optical integrator for dividing a wave front of light from the light source, to provide the light beams.

7. A system according to claim 6, wherein the light source comprises a laser.

8. A projection exposure apparatus comprising an illumination system as recited in any one of claims 5, 6 and 7 and a projection optical system for projecting a pattern of a mask, illuminated by said illumination system, onto a substrate.

9. A scan type exposure apparatus for scanning a mask and a substrate with light in a scanning direction to thereby expose the substrate with a pattern of the mask, said apparatus comprising:
  a light source for providing plural light beams; and
  an irradiation optical system for projecting the light beams from said light source to a surface to be illuminated, so that the light beams are superposed one upon another on the surface, wherein said irradiation optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

10. An apparatus according to claim 9, wherein said irradiation optical system defines on the mask a light pattern having an illuminance distribution of a substantially trapezoidal shape in the scanning direction and an illuminance distribution of substantially rectangular shape in a direction perpendicular to the scanning direction.

11. An apparatus according to claim 9, wherein said irradiation optical system comprises an optical integrator for dividing a wave front of light from the light source, to provide the light beams.

12. An apparatus according to claim 11, wherein the light source comprises an excimer laser.

13. A scan type apparatus for scanning a mask and a substrate with light in a scanning direction to thereby expose the substrate with a pattern of the mask, said apparatus comprising:
  secondary light source forming means for forming a secondary light source with light from a light source; and
  a collecting optical system for projecting light beams from said secondary light source to a surface to be illuminated, so that the light beams are superposed one upon another on the surface, wherein said collecting optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

14. An apparatus according to claim 13, wherein said collecting optical system defines on the mask a light pattern having an illuminance distribution of a substantially trapezoidal shape in the scanning direction and an illuminance distribution of substantially rectangular shape in a direction perpendicular to the scanning direction.

15. An apparatus according to claim 13, wherein said irradiation optical system comprises an optical integrator for dividing a wave front of light from the light source, to provide the light beams.

16. An apparatus according to claim 15, wherein the light source comprises a laser.

17. A scan type exposure apparatus for scanning a mask and a substrate with light in a scanning direction to thereby expose the substrate with a pattern of the mask, said apparatus comprising:
  a laser;
  secondary light source forming means for forming a secondary light source with light from said laser; and
  a collecting optical system for projecting light beams from said secondary light source to a surface to be illuminated, so that the light beams are superposed one upon another on the surface, wherein said collecting optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

18. An apparatus according to claim 17, wherein said collecting optical system defines on the mask a light pattern having an illuminance distribution of a substantially trapezoidal shape in the scanning direction and an illuminance distribution of substantially rectangular shape in a direction perpendicular to the scanning direction.

19. An apparatus according to claim 17, wherein said secondary source forming means comprises an optical integrator for dividing a wave front of light from said laser to provide the light beams.

20. An apparatus according to claim 19, wherein said laser comprises an excimer laser.

21. An apparatus according to claim 20, further comprising a projection optical system for imaging the pattern of the mask on the substrate.

22. A device manufacturing method for printing a device pattern of a mask onto a substrate, said method comprising:

providing plural light beams from a light source; and projecting, using an irradiation optical system, the light beams from the light source to a surface to be illuminated, so that the light beams are superposed one upon another on the surface, wherein the irradiation optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

23. A device manufacturing method for printing a device pattern of a mask onto a substrate, said method comprising:

forming a secondary light source with light from a light source, using secondary light source forming means; and projecting, using a collecting optical system, light beams from the secondary light source to a surface to be illuminated, so that the light beams are superposed one upon another on the surface, wherein the collecting optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

24. A device manufacturing method for printing a device pattern of a mask onto a substrate, said method comprising:

providing plural light beams using a light source; and projecting, using an irradiation optical system, the light beams from said light source to a surface to be illuminated, so that the light beams are superposed one upon another on the surface, wherein the irradiation optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

25. A device manufacturing method for printing a device pattern of a mask onto a substrate, said method comprising:

forming a secondary light source with light from a light source, using secondary light source forming means; and projecting, using a collecting optical system, light beams from the secondary light source to a surface to be illuminated, so that the light beams are superposed one upon another on the surface, wherein the collecting optical system has different focal point positions with respect to first and second mutually orthogonal sectional planes, respectively, so that the focal point with respect to the first sectional plane is off the surface to be illuminated while the second focal point position with respect to the second sectional plane is substantially coincident with the surface to be illuminated.

26. A device manufacturing method for printing a device pattern of a mask onto a substrate, said method comprising:

providing a laser;

forming a secondary light source with light from the laser, using secondary light source forming means; and projecting, using a collecting optical system, light beams from the secondary light source to a surface to be illuminated, so that the light beams are superposed one upon another on the surface, wherein the collecting optical system has different focal point positions with respect to first and second mutually orthogonal sectional planes, respectively, so that the focal point position with respect to the first sectional plane is off the surface to be illuminated while the second focal point position with respect to the second sectional plane is substantially coincident with the surface to be illuminated.

* * * * *

UNITED STATES PATENT AND TRADEMARK OFFICE
CERTIFICATE OF CORRECTION

PATENT NO. : 5,719,617
DATED : February 17, 1998
INVENTOR(S) : KAZUHIRO TAKAHASHI, ET AL.

It is certified that error appears in the above-identified patent and that said Letters Patent is hereby corrected as shown below:

ON THE COVER PAGE:

Under "References Cited" item [56]

"5,463,497  10/1995  Muraki etal." should read
--5,463,497  10/1995  Muraki et al.--;
"5,475,491  12/1995  Shiozawaa" should read
--5,475,491  12/1995  Shiozawa--; and Under "FOREIGN PATENT DOCUMENTS", insert

--          OTHER PUBLICATIONS

O Plus E, No. 159, Feb. 1993, pages 96 through 99.--.

COLUMN 4:

Line 17, "a" should read --an--;

COLUMN 7:

Line 30, "one" should read --is on--.

UNITED STATES PATENT AND TRADEMARK OFFICE
CERTIFICATE OF CORRECTION

PATENT NO. : 5,719,617
DATED : February 17, 1998
INVENTOR(S) : KAZUHIRO TAKAHASHI, ET AL.

It is certified that error appears in the above-identified patent and that said Letters Patent is hereby corrected as shown below:

COLUMN 8:

Line 22, "IC" should read --an IC--.

Signed and Sealed this

Fifteenth Day of September, 1998

Attest:

BRUCE LEHMAN

*Attesting Officer*      *Commissioner of Patents and Trademarks*